United States Patent [19]

Ohsawa et al.

[11] 4,345,371
[45] Aug. 24, 1982

[54] METHOD AND APPARATUS FOR MANUFACTURING HYBRID INTEGRATED CIRCUITS

[75] Inventors: Mitsuo Ohsawa, Kanagawa; Yoshiteru Noda, Tokyo; Iwao Ichikawa; Katsumi Yamamoto, both of Kanagawa, all of Japan

[73] Assignee: Sony Corporation, Tokyo, Japan

[21] Appl. No.: 135,670

[22] Filed: Mar. 31, 1980

[30] Foreign Application Priority Data

Mar. 14, 1979 [JP] Japan .................................. 54-58888
Mar. 16, 1979 [JP] Japan .................................. 54-59914

[51] Int. Cl.$^3$ .......................... H05K 3/30; B23P 19/00
[52] U.S. Cl. ........................................ 29/836; 29/740; 29/834; 29/840; 221/93; 221/94; 228/180 A
[58] Field of Search ............... 228/180 A, 180 R, 179; 221/93, 94; 29/840, 740, 834, 424, 836; 174/68.5

[56] References Cited

U.S. PATENT DOCUMENTS

| | | | |
|---|---|---|---|
| 3,417,542 | 12/1968 | Merrill et al. ...................... | 221/93 X |
| 3,859,723 | 1/1975 | Hamer et al. ...................... | 29/740 X |
| 4,064,287 | 12/1977 | Lipson et al. ........................ | 29/424 |
| 4,127,432 | 11/1978 | Kuwano et al. ................... | 29/740 X |
| 4,139,881 | 2/1979 | Shimizu et al. ............. | 228/180 R X |
| 4,141,055 | 2/1979 | Berry et al. ................ | 174/68.5 X |
| 4,208,005 | 6/1980 | Nate et al. ...................... | 228/179 X |

Primary Examiner—Francis S. Husar
Assistant Examiner—Carl J. Arbes
Attorney, Agent, or Firm—Lewis H. Eslinger; Alvin Sinderbrand

[57] ABSTRACT

A hybrid integrated circuit is manufactured by
placing chip-type circuit elements on predetermined portions of a template;
preparing a printed circuit board having predetermined conductive patterns thereon and adhesive material at predetermined portions thereof;
placing the printed circuit board on the template so as to bring the circuit elements into contact with the adhesive material;
turning the template with the circuit board upside down and then transferring the circuit elements to the circuit board by removing the template from the circuit board;
hardening the adhesive material to temporarily hold the circuit elements on the circuit board; and
soldering the circuit elements to conductive patterns formed on the circuit board, so as to electrically connect the circuit elements with the conductive patterns.

An element-distributing apparatus for practicing the foregoing method comprises a hopper containing a plurality of the chip-type elements, a capture element for removing the elements from the hopper, a shutter for controlling the distribution of the elements, and a template having element-receiving apertures at the predetermined locations.

10 Claims, 14 Drawing Figures

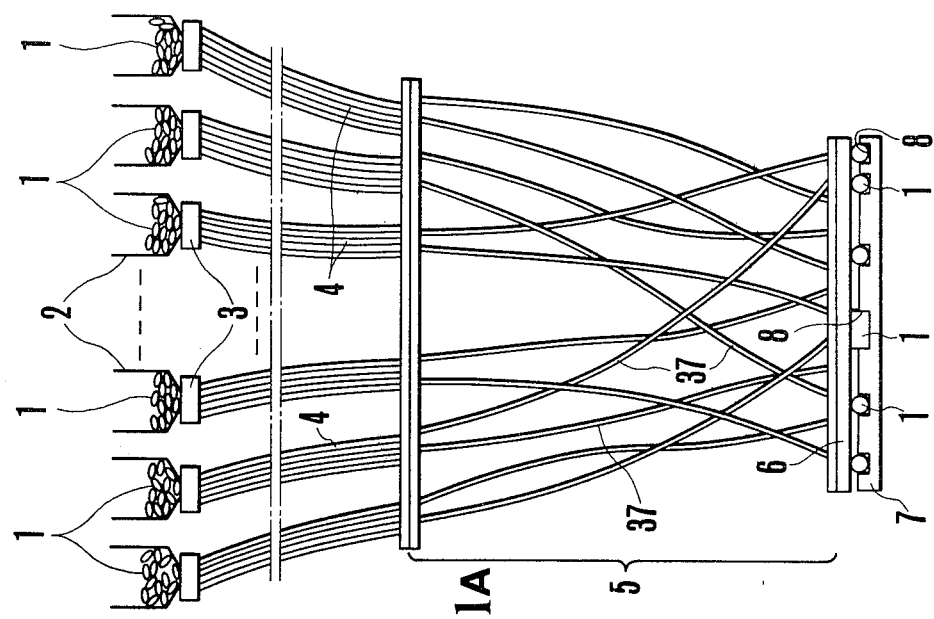
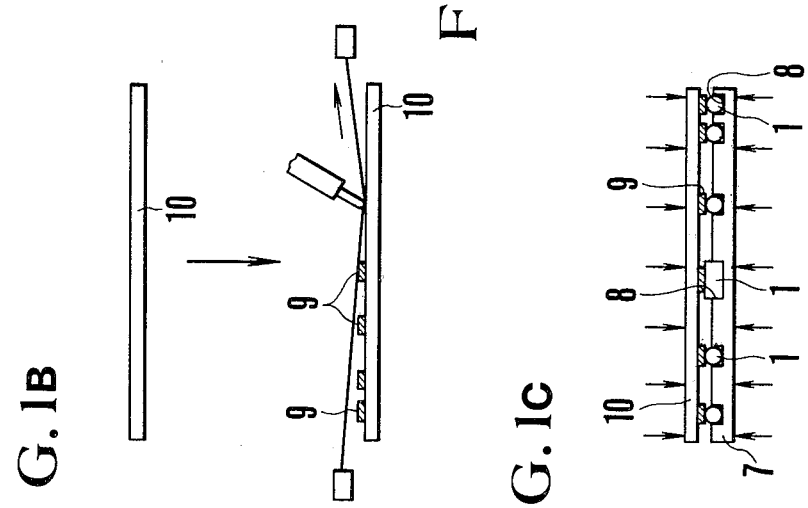

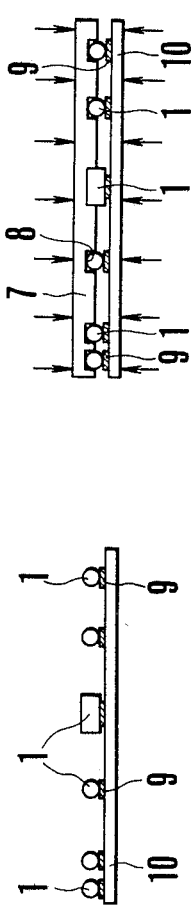
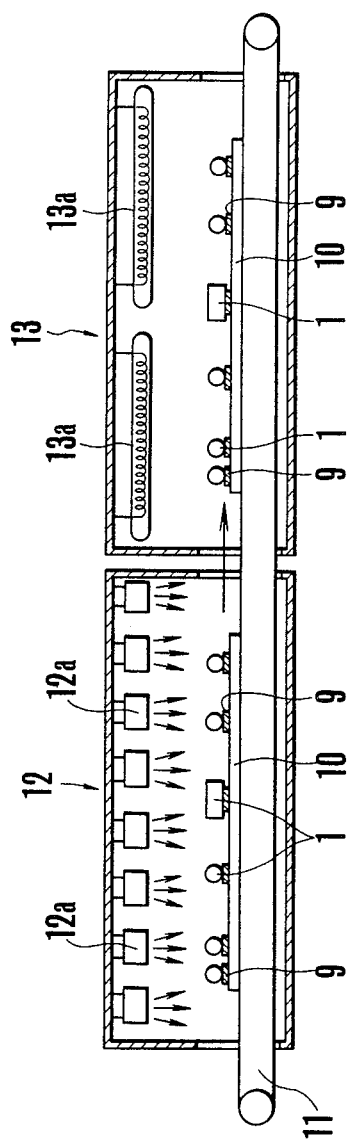

METHOD AND APPARATUS FOR MANUFACTURING HYBRID INTEGRATED CIRCUITS

BACKGROUND OF THE INVENTION

1. Field of the Invention

The present invention relates to method and apparatus for manufacturing a hybrid integrated circuit, and more particularly relates to a method and apparatus of manufacturing a hybrid integrated circuit in which a plurality of chip-type electrical parts (circuit elements) are mounted on a printed circuit board.

2. Description of the Prior Art

In the present state of the art, a so-called insertion machine is available for mounting electrical parts with leads-for example, resistors, capacitors or diodes-on a printed circuit board. This insertion machine has an insertion head through which the electrical parts are inserted one by one into holes must be precut in the circuit board. Accordingly, an unduly long operation time is required for completing the circuit board for electronic devices having a large number of electrical parts, such as radio receivers, television receivers, video tape recorders and the like. In addition to this, it is necessary according to the conventional technique to bend the lead wires of the electrical parts which have been inserted into the holes in the circuit board. This method has a further disadvantage that because of the use of the electrical parts having lead the integration density of the circuit board is far less than necessary.

To avoid these disadvantages, another method has been proposed, wherein numerous chip-type electrical parts, pre-arranged to be distributed at given positions through a guide means, are directly dropped onto a printed circuit board having adhesive material coated onto it beforehand. In this technique, a shutter disposed below the guide means is opened to permit the parts to drop into place. However, this method affords poor accuracy in the distribution of the electrical parts to the circuit board because the technique involves dropping the parts to be mounted.

OBJECTS AND SUMMARY OF THE INVENTION

An object of the present invention is to provide a novel and inventive method and apparatus which can overcome the abovedescribed disadvantages of the conventional techniques.

Another object of the present invention is to provide a method by which a number of chip-type electrical parts can be simultaneously and speedily mounted on a printed circuit board.

A further object of the present invention is to provide a method which can achieve a high integration density in the mounting of a number of chip-type electrical parts on a printed circuit board.

A further object of the present invention is to provide a method by which chip-type electrical parts can be securely connected to conductive patterns formed on a printed circuit board.

A further object of the present invention is to provide a method by which temporary bonding of electrical parts with a printed circuit board can be easily effected by the use of photosetting adhesive material.

A further object of the present invention is to provide a method by which chip-type electrical parts and electrical parts with lead wires can be simultaneously integrated on a printed circuit board.

A still further object of the present invention is to provide an apparatus in which numerous chip-type electrical parts can be selectively positioned at respective predetermined locations.

According to one aspect of the present invention, a method of manufacturing a hybrid integrated circuit comprises the steps of placing a plurality of chip-type circuit elements at predetermined positions on a template; applying adhesive material at corresponding respective locations on a printed circuit board on which a conductive pattern is printed; placing the printed circuit board against the template so as to bring the circuit elements into contact with the adhesive material; removing the template from the board; rendering the adhesive material sufficiently set to hold the circuit elements on the board; and soldering the circuit elements to the conductive pattern on the board. Preferably, the adhesive material includes a photo-setting resin, and the resin is rendered set first by irraditing it with, for example, ultraviolet light, and subsequently by heating it in an oven.

The method of this invention can readily be carried out by apparatus for manufacturing a hybrid integrated circuit comprising a hopper containing a plurality of the chip-type circuit elements; a capture mechanism for capturing the circuit elements from the hopper; a guide assembly for guiding the captured circuit elements to predetermined positions corresponding to predetermined locations on the printed circuit board; a shutter disposed between the capture mechanism and the guide assembly to control the distribution of the circuit elements from the capture element to the guide assembly; and a template having element-receiving receptacles at the predetermined positions to receive the circuit elements from the guide assembly for disposition onto the printed circuit board.

The above and other objects, features and advantages of the present invention will be apparent from the following detailed description of illustrative embodiments thereof which is to be read in connection with the accompanying drawings.

BRIEF DESCRIPTIONS OF THE DRAWINGS

FIG. 1A to FIG. 1I show the various steps of an entire process according to one embodiment of the present invention;

DESCRIPTION OF THE PREFERRED EMBODIMENTS

Figure 1G:
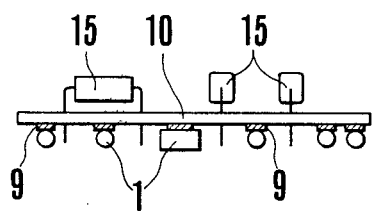

With reference to the drawings and initially to FIGS. 1A-1I thereof, one embodiment of the method according to the present invention will be now described mainly with reference to FIG. 1A to.

Figure 4:
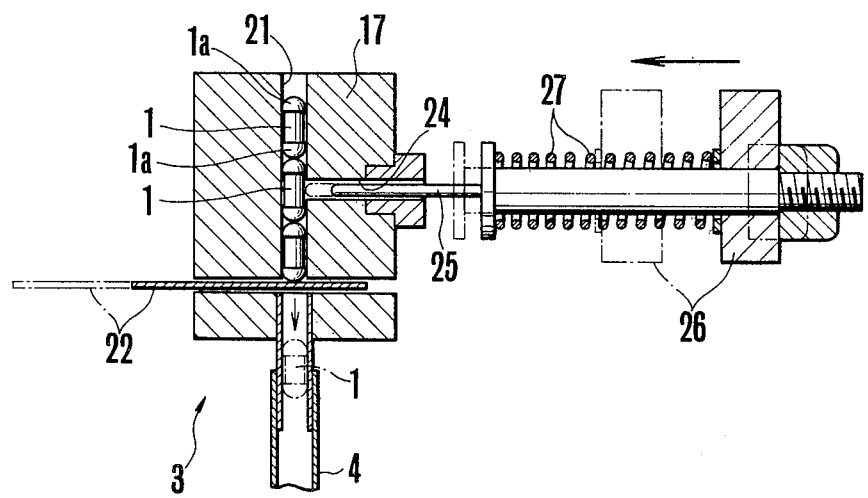
FIG. 4 is a cross-sectional view taken along the line IV—IV in FIG. 2.

Various kinds of chip-type circuit elements (electrical parts) 1 having respective predetermined shapes, for example, condensers, resistors, cross-conductors or jumpers, and diodes, are together contained in random orientations in a container 2 of a hopper. The circuit elements 1 are substantially cylinder-shaped having electrodes 1a at respective end portions as shown in FIG. 4. The circuit elements 1 are intermittently supplied from the container 2 by operating a shutter mechanism 3, described below, and then are led to a magazine 5 through a carrier pipe 4. The magazine 5 is so designed that each kind of circuit elements 1 is channelled to its corresponding predetermined position. The circuit elements 1 then arrive, in a vertical attitude, at a disposition plate 6, and are subsequently turned to a horizontal attitude by means of a turning mechanism (not shown) provided in the plate 6. Once this condition is achieved, a shutter 39 (See FIG. 2) disposed below the plate 6 is opened, and the circuit elements 1 are dropped into respective part-receiving recesses 8 formed in the upper surface of a template 7 disposed beneath the plate 6. Thus, the circuit elements are received in the recesses 8 of the template 7.

A printed circuit board 10 shown in FIG. 1B has a pattern surface on which adhesive material 9 such as a photo-setting adhesive resin is coated at positions corresponding to mounting locations for the chip-type electrical parts. Preferably, a screen printing technique is used to apply this adhesive material 9, as shown in FIG. 1B. After the circuit elements 1 are distributed in the recesses 8 of the template 7, the pattern surface of the printed circuit board 10, on which adhesive material 9 is coated is placed opposite to the template 7 so as to bring the circuit elements 1 into contact with the adhesive material 9. Thus, the printed circuit board 10 is pressed against the template 7, using a slight pressure as shown in FIG. 1C. While pressure is maintained, the template 7 and the printed circuit board 10 are turned upside down so that the positional relationship therebetween is inverted as shown in FIG. 1D. As the result, the template 7 is disposed above the printed circuit board 10. These are then placed in a press and pressure-joined, which causes a complete adherence of the central portions of circuit elements 1 in the recesses 8 of the template 7 to the adhesive material 9 or the printed circuit board 10 so that the elements 1 are securely positioned in respect to the conductive patterns on the printed circuit board 10.

The template 7 is then gently removed from the printed circuit board 10 so that the circuit elements 1 was completely transposed onto the printed circuit board 10 as shown in FIG. 1E. Because the adhesive material 9 is not yet hardened at this point, as shown in FIG. 1F, the printed circuit board 10 is guided by means of a conveyor 11 into a UV oven 12 having an ultraviolet (UV) radiation source 12a for photo-chemically hardening the adhesive material 9. As the result of this treatment with UV radiation, the surface area of the adhesive material 9 is first hardended to form a rigid skin. The printed circuit board 10 is subsequently moved by the conveyor 11 into a thermal oven 13 having a heat source 13a for thermally hardening the adhesive material 9. This additional hardening treatment sufficiently hardens the inner portions of the adhesive material 9. Accordingly, the time required for hardening the adhesive material 9 can be shortened because two kinds of ovens 12 and 13 are used in series. By way of contrast, if the printed circuit board 10 is suddenly heated in the oven 13, the viscosity of the adhesive material 9 is reduced to the point that it flows away from the predetermined locations on the board 10, so that the adherence of the circuit elements 1 to the printed circuit board 10 is deteriorated and the fluidized adhesive unnecessarily covers the conductive patterns of the printed circuit board 10. The latter effect is particularly troublesome in that it causes a poor contact between the circuit elements 1 and the conductive patterns. However, in this invention because the external surface of the adhesive material 9 is first hardened by the treatment with ultraviolet radiation in the oven 12, the above-described fluidization of the adhesive material 9 can be effectively prevented.

Figure 1H:
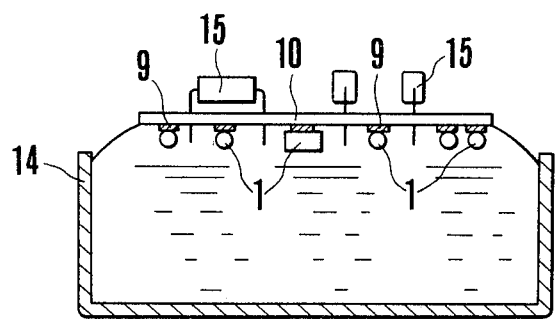
Figure 1I:
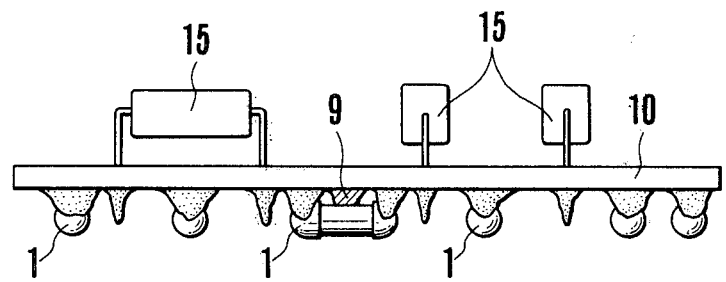

Following the above described steps of the method of this invention, the circuit elements 1 are rendered affixed rendered completely fixed to the printed circuit board 10 as soon as the adhesive material 9 is sufficiently hardened. Next, if, as shown in FIG. 1G, it is deemed necessary, or desirable electrical parts 15 having lead wires are inserted into penetrating holes in the printed circuit board 10 from its back side that is, the side thereof opposite to the pattern surface with the circuit elements 1 mounted thereon. By mounting the electrical parts 1 and 15 on the opposite surfaces of the printed circuit board 10, the electric circuit formed thereon can be miniaturized with a packing density that is considerably higher than that attainable with conventional techniques. As shown in FIG. 1H, the printed circuit board 10 is then brought to a soldering tank 14 with the pattern surface downwards, so that the pattern surface faces the molten solder. Then the printed circuit board 10 is dipped into the molten solder to electrically connect the circuit elements 1 with the conductive patterns of the printed circuit board 10. That is, the chip-type parts 1 are connected at their cap-shaped electrodes 1a by solidified solder to the conductive patterns of the printed circuit board 10, while the parts 15 are similarly connected at their exposed lead wires to the conductive patterns on the pattern surface. Thus, a hybrid integrated circuit with high integration density can be manufactured (See FIG. 1I). However, the parts 15 with the lead wires can be omitted and a hybrid integrated circuit utilizing only the chip-type parts 1 mounted thereon can be obtained.

The above-described method of this embodiment has a unique feature in that after a plurality parts 1 are simultaneously dropped from the disposition plate 6 onto the template 7 on the opening operation of the shutter, the template 7 is contacted with the printed circuit board 10 to transfer all the chip-type parts 1 to the printed circuit board 10 at the same time. Accordingly, the productivity of the manufacturing of such a greatly hybrid integrated circuit improved in respect to prior art techniques. In practice, the manufacture of a hybrid integrated circuit, in which up to six hundred parts 1 are mounted on the printed circuit board 10, can be completed within thirty minutes.

In addition, this method results in a highly improved accuracy in distribution of the parts 1 to be mounted on the printed circuit board 10 so that the frequency of incidence of defective integrated circuits is remarkably decreased in number. This benefit ensures because the parts 1 are received in the recesses 8 of the template 7 and then transferred to the printed circuit board 10. When it is intended to manufacture small-size electric circuits, these circuits are integrated on the printed circuit board 10, and after the mounting of the electrical parts this board 10 is divided into many chips each of which has one small-size electric circuit. By such a technique, plural integrated circuits can be simultaneously manufactured, thereby further improving productivity.

An apparatus for distributing the circuit elements 1 to the template 7 will be now explained in detail with reference to FIG. 2. In this apparatus, a capture mechanism 18 is slidably inserted into the bottom of the cylindrical container 2 of the hopper. The capture mechanism 18 is so designed as to move up and down relatively to the container 2 in order to catch the parts 1 in the container 2 by three penetrating holes 19 formed in the capture mechanism 18. The capture mechanism 18 can catch three parts 1 at once in the container 2. These caught parts are led to penetrating holes 21 of a parts holder 17 through separate pipes 20.

Figure 3:
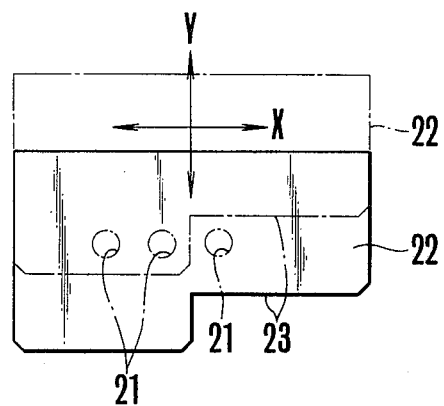
FIG. 3 is a plan view taken along the line III—III in FIG. 2.

A shutter 22 included in the afore-said shutter means 3 is provided beneath the parts holder 17. The shutter 22 is opened to permit the parts 1 in the parts holder 17 to be dropped. As shown in FIG. 3, the shutter 22 having a notched portion 23 at its front margin can be moved in a first direction, here shown as the X-direction. The moving distance of the shutter 22 in the X-direction is previously so adjusted that the number of the parts 1 to be fed from the pipe 20 can be optionally controlled in the range of 0 to 3 parts when the shutter 22 is opened in the Y-direction that is, in the direction perpendicular to the X-direction. For instance, when the position of the shutter 22 is adjusted in the X-direction as shown in FIG. 3, the chip-type circuit elements 1 can be fed through only one penetrating hole 21 among the above three penetrating holes after the shutter 22 is moved in the Y-direction up to the position indicated by the dot-dash line.

In the shutter means 3, the parts 1 are to be supplied one by one through each penetrating hole 21 on the opening of the shutter 22. To assure that only one part is dropped at each such opening, the parts holder 17 has a penetrating hole 24 intersecting with the penetrating hole 21 at right angle, into which a pin 25 is inserted, as shown in FIG. 4. The end of the pin 25 faces the penetrating hole 21. In these arrangements, when a pressing plate 26 is moved to the left as shown in FIG. 4 on the opening of the shutter 22, the plate 26 presses the pin 25 through a coil spring 27. Thus, the end of the pin 25 laterally biases the second parts 1 against a surface of the penetrating hole 21, so that the second parts 1 remain in the penetrating hole 21, while only the first parts 1 positioned immediately above the shutter 22 are permitted to drop downward through the carrier pipe 4. Thus, only a small part 1 is fed from the penetrating hole 21 to the pipe 4 on the opening of the shutter 22.

Figure 5:
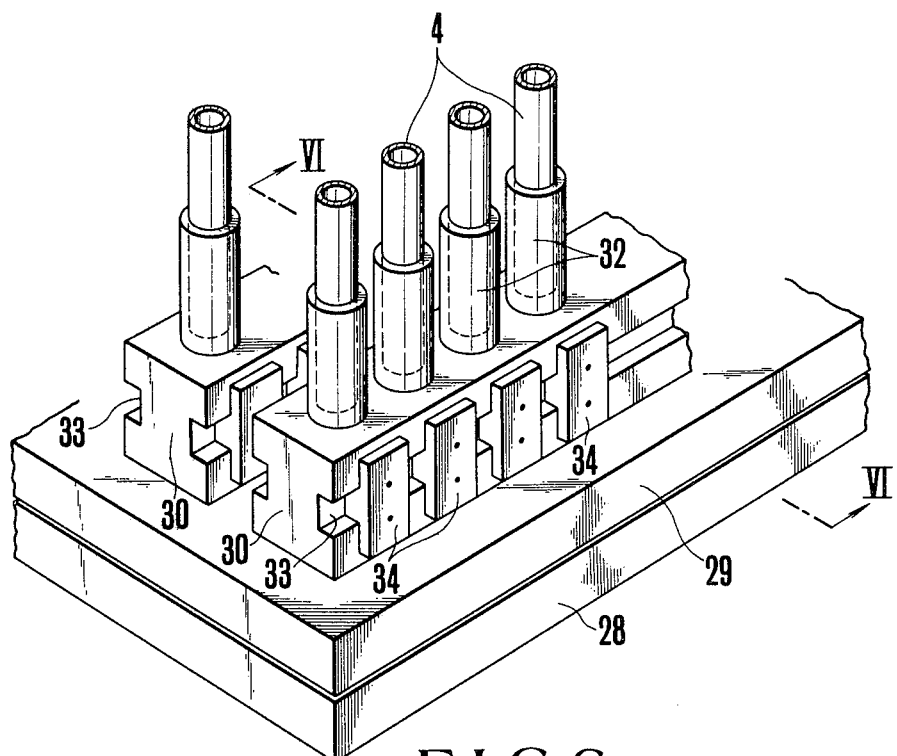
FIG. 5 is a perspective view of a sensor for detecting the passage of electrical parts.
Figure 6:
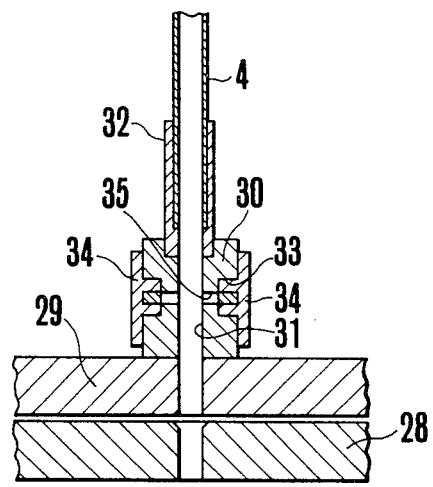
FIG. 6 is a cross-sectional view taken along the line VI—VI in FIG. 5.

The parts 1, thus fed, continue through the pipe 4 to the magazine 5. A sensor-supporting plate 29 overlaps an upper plate 28 of the magazine 5. The sensor-supporting plate 29 has a sensor-supporting block 30 on its upper surface as shown in FIG. 5 through which a penetrating hole 31 corresponding to the pipe 4 is formed (See FIG. 6). The hole 31 is communicated with the pipe 4 via a connecting pipe 32. The sensor-supporting block 30 has recessed grooves 33 at two opposed sides to which photo-sensors 34 are fixed opposite each other. These sensors 34 are so arranged as to detect the passage of the parts 1 through the penetrating hole 31 by means of light transmitted through small holes 35. These sensors 34 detect whether the parts 1 in the penetrating hole 31 corresponding to the penetrating hole 21 of the shutter mechanism 3 that permits passage of the parts 1, actually pass therethrough when the position of the shutter 22 is adjusted in the X-direction. Accordingly, it is possible to detect whether the proper number of parts 1 passes through the hole 31 by displaying the output signals of the sensor 34.

Figure 2:
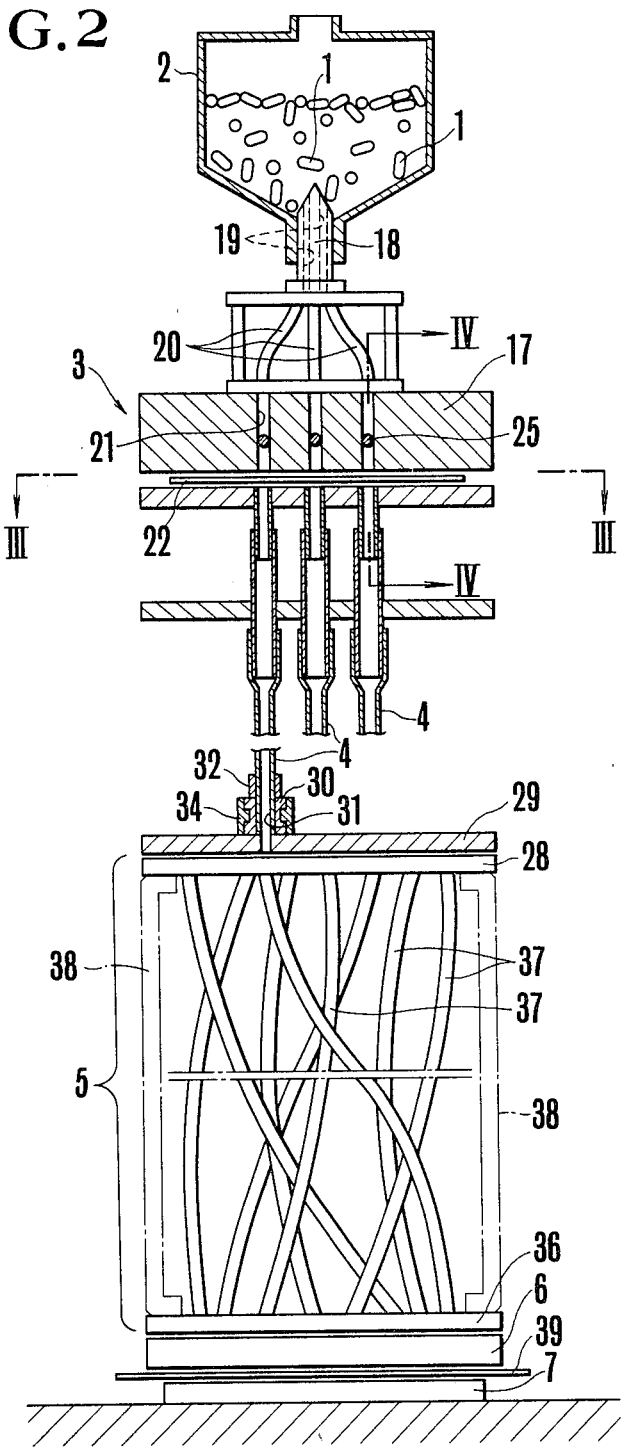
FIG. 2 is an enlarged front view of a part-distributing apparatus as used in the embodiment of FIGS. 1A-1I, in which the main portions are shown in cross-section.

In the magazine 5 the upper plate 28 and the lower plate 36, penetrating holes (not shown) formed in both plates 28 and 36 for passing the parts are connected to each other by pipes 37 intersecting in an arbitrary, predetermined fashion with each other, as shown in FIG. 2. By this arrangement, each kind of the parts 1 is led to its predetermined position from the pipe 4. The magazine 5 is used for bringing the parts 1 from the container 2 of the hopper to the predetermined position appropriate for the kind of electric circuit to be manufactured. Both plates 28 and 36 of the magazine 5 are connected to each other with connecting members 38 as shown in dot-dash lines in FIG. 2 so that the magazine 5 is assembled as one body. In this assembly, by the use of the connecting members 38, the magazine 5 is detachably attached to one such apparatus. Accordingly, the magazine 5 already set in the apparatus can be replaced, within a very short time, by a new one prepared beforehand, when it is necessary to change the circuit design of the electric circuit to be manufactured. The set up of the apparatus to manufacture the electric circuit with a different circuit design can be thus easily changed. When the magazine 5 is replaced as mentioned above, the displacement of the shutter 22 in the X-direction for each container 2 of the hopper as well as the selection of the sensor 34 can be easily changed by use of an automatic control unit, for instance, by exchanging a memory device such a magnetic tape having a given memoried programming. The sensor 34 is positioned nearer to the hopper than the magazine 5 and operates independently of the magazine 5. Therefore, when the magazine 5 is changed, it is not required to mechanically change the sensor 34 so that the apparatus of this invention further improves the ease in the afore-said change of the design of the circuit.

The chip-type circuit elements 1 guided by the magazine 5 to the predetermined positions are turned sideways in the disposition plate 6, and then introduced into the recesses 8 of the template 7 by opening the shutter 39. These arrangements can ensure a considerably high productivity because the circuit elements are all distributed onto the template at one time. In this case, the accuracy in the distribution of the circuit elements depends on the receiving recesses of the template, so such accuracy can be increased relatively easily. Still further, because the circuit elements are disposed at random orientations in the container on the above-described technique the cost of the circuit elements is lowered as the ease of assembly to increased.

While the present invention is illustrated with specific embodiments, it will be recognized by persons skilled in the art that many modifications and variations may be made without departing from the true scope of the invention as defined by the following claims.

What is claimed is:

1. A method of manufacturing a hybrid integrated circuit on a circuit board in which circuit elements are positioned at predetermined locations on said board and electrically connected with a conductive pattern on said board, comprising the steps of:
   placing a plurality of chip-type circuit elements at respective predetermined positions on an upper side of a template;

applying adhesive material at respective locations on one side of said board corresponding to said predetermined positions;

placing said circuit board, adhesive side down, against said template so as to bring said circuit elements into contact with said adhesive material;

inverting said circuit board with said template thereagainst so that the latter is positioned above said circuit board;

removing said template from said board;

rendering said adhesive material sufficiently set to hold said circuit elements on said board; and soldering said circuit elements to said conductive pattern to said board.

2. A method according to claim 1, wherein said adhesive material includes a photo-setting resin, and the step of rendering set includes irradiating said photo-setting resin with light.

3. A method according to claim 2, further including, after irradiating said resin, heating said resin.

4. A method according to claim 3, wherein said irradiating is carried out sufficiently to form a hardened skin on said resin, and said heating is carried out sufficiently to cause interior portions of said resin to harden.

5. A method according to claim 1, further comprising, before the step of soldering, the step of mounting electrical parts with leads onto the side of said circuit board opposite to the side on which said circuit elements are disposed.

6. A method according to claim 5, wherein said leads of said electrical parts penetrate said board, and said step of soldering includes soldering said leads and said elements at the same time to said conductive pattern.

7. A method according to claim 1, wherein said step of placing said circuit elements includes selectively supplying said circuit elements from a hopper, through conduits, to said predetermined positions on said template.

8. Apparatus for manufacturing a hybrid integrated circuit in which chip-type circuit elements are positioned at predetermined locations on a printed circuit board, comprising hopper means for containing a plurality of said chip-type circuit elements;

capture means for capturing said circuit elements in said hopper means;

guide means for guiding the captured circuit elements to predetermined locations;

shutter means, disposed between said capture means and said guide means, for controlling the distribution of said circuit elements from said capture means to said guide means; and selectable template means corresponding to a selected circuit design for said hybrid integrated circuit for receiving said circuit elements from said guide means for disposition onto said printed circuit board, and having element-receiving receptacles at predetermined locations thereon corresponding to said selected circuit design;

wherein said guide means includes a magazine detachably mountable between said shutter means and said template means, the magazine having a plurality of flexible channels between said shutter means and said template means said flexible channels being pre-arrangeable, before mounting said magazine in said apparatus, to guide said elements to the particular predetermined positions of the selected template means without needing to rearrange said hopper means, in accordance with the particular circuit design for said hybrid integrated circuit.

9. Apparatus according to claim 8, wherein said shutter means comprises a blade that is selectively opened to permit passage of said circuit elements to said receptacles of said template means.

10. Apparatus according to claim 8, further comprising means, disposed between said hopper means and said magazine, for detecting passage of said circuit elements from said shutter means to said template means.

* * * * *